United States Patent
Smith

(10) Patent No.: US 8,338,267 B2
(45) Date of Patent: Dec. 25, 2012

(54) SYSTEMS AND METHODS FOR VERTICALLY INTEGRATING SEMICONDUCTOR DEVICES

(75) Inventor: Larry Smith, Austin, TX (US)

(73) Assignee: Sematech, Inc., Austin, TX (US)

( * ) Notice: Subject to any disclaimer, the term of this patent is extended or adjusted under 35 U.S.C. 154(b) by 576 days.

(21) Appl. No.: 11/776,069

(22) Filed: Jul. 11, 2007

(65) Prior Publication Data

US 2009/0017580 A1    Jan. 15, 2009

(51) Int. Cl.
    *H01L 21/762* (2006.01)
(52) U.S. Cl. ........................................ 438/458; 257/700
(58) Field of Classification Search .................. 438/126, 438/12, 13, 39–44, 115, 458, 459, 626, 631, 438/633, 689–757, 759, 940, 959, 963, 977; 257/700, 778, 797
    See application file for complete search history.

(56) References Cited

U.S. PATENT DOCUMENTS

| | | | | |
|---|---|---|---|---|
| 5,734,201 | A * | 3/1998 | Djennas et al. | 257/783 |
| 6,477,034 | B1 * | 11/2002 | Chakravorty et al. | 361/306.3 |
| 6,528,408 | B2 * | 3/2003 | Kinsman | 438/613 |
| 6,716,672 | B2 | 4/2004 | Val | 438/109 |
| 6,794,273 | B2 * | 9/2004 | Saito et al. | 438/462 |
| 6,809,367 | B2 | 10/2004 | Val | 257/301 |
| 6,992,891 | B2 * | 1/2006 | Mallik et al. | 361/704 |
| 7,226,812 | B2 * | 6/2007 | Lu et al. | 438/114 |
| 7,354,802 | B1 * | 4/2008 | Poddar et al. | 438/113 |
| 7,456,083 | B2 * | 11/2008 | Noma et al. | 438/460 |
| 7,557,443 | B2 * | 7/2009 | Ye et al. | 257/723 |
| 2001/0005313 | A1 * | 6/2001 | Muramatsu et al. | 361/768 |
| 2003/0020142 | A1 * | 1/2003 | Wachtler | 257/620 |
| 2005/0110131 | A1 * | 5/2005 | Lee | 257/701 |
| 2005/0277231 | A1 * | 12/2005 | Hembree et al. | 438/127 |
| 2006/0284312 | A1 * | 12/2006 | Lee | 257/734 |
| 2007/0004050 | A1 * | 1/2007 | Ikeda et al. | 438/4 |
| 2007/0108579 | A1 * | 5/2007 | Bolken et al. | 257/680 |
| 2007/0145574 | A1 * | 6/2007 | Colbert et al. | 257/721 |
| 2007/0222089 | A1 * | 9/2007 | Maruyama | 257/797 |
| 2008/0258267 | A1 * | 10/2008 | Nakashima | 257/621 |

OTHER PUBLICATIONS

Bogatin, "'Chips-First' technology: has its time finally come?" *Electronic Packaging & Production*, 2002.
Chappell, "3D Interconnect technology coming to light," *Electronic News*, 2004.
Souriau et al., "Wafer level processing on re-built wafer for chip staking," *Electronics Packaging Technology Conference*, 2005.

* cited by examiner

*Primary Examiner* — Zandra Smith
*Assistant Examiner* — Ali Naraghi
(74) *Attorney, Agent, or Firm* — Fulbright & Jaworski L.L.P.

(57) ABSTRACT

Systems and methods for vertically integrating semiconductor devices are described. In one embodiment, a method comprises providing an interposer, aligning and bonding a plurality of die to a first surface of the interposer, aligning and bonding a backplate to the plurality of die, and reducing at least one portion of the interposer to create a reconstituted wafer. In another embodiment, an apparatus comprises an interposer operable to receive at least one donor semiconductor device disposed on a first surface of the interposer and aligned therewith, and at least one host semiconductor device disposed on a second surface of the interposer and aligned therewith; where the interposer allows the at least one donor and host semiconductor devices to become vertically integrated.

18 Claims, 3 Drawing Sheets

SYSTEMS AND METHODS FOR VERTICALLY INTEGRATING SEMICONDUCTOR DEVICES

BACKGROUND OF THE INVENTION

1. Field of the Invention

The present invention relates generally to semiconductor fabrication, and more particularly, to systems and methods for vertically integrating semiconductor devices.

2. Description of Related Art

Vertical integration of semiconductor devices, commonly referred to as "3D interconnect," may be accomplished using die-to-wafer or wafer-to-wafer flows by which a "donor" die or wafer is stacked on top of a "host" wafer. Of these two methods, die-to-wafer processes provide the most advantageous form of integration. For example, die-to-wafer processes includes the ability to pre-screen or otherwise test donor die, thus allowing the manufacturer to select only devices that have passed the test for further integration and discard the bad ones. In contrast, in a wafer-to-wafer process, all die (good and bad) present on the donor wafer are integrated into the host wafer (which also contains good and bad die).

Additionally, the die-to-wafer process can maximize the number of donor die that are fabricated on a wafer when the donor die are smaller than the host die. For example, if donor die are smaller than host die, the donor wafer can have the donor die close together so as to maximize donor wafer yield. Meanwhile, wafer-to-wafer integration typically results in unused silicon between the individual donor die.

Despite the foregoing, there are several significant drawbacks with respect to existing die-to-wafer integration methods. For example, die-to-wafer integration generally requires that die be individually aligned and bonded to the host wafer. This step can be very time consuming, and it may take many hours per wafer depending upon the required alignment accuracy, die bond time, and the number of dies per wafer. Additionally, die-to-wafer processes produce a non-planar surface that is incompatible with certain 3D integrations requiring further wafer-level processing.

BRIEF SUMMARY OF THE INVENTION

The present invention provides systems and methods for vertically integrating semiconductor devices. In one illustrative embodiment, a method comprises providing an interposer, aligning and bonding a plurality of die to a first surface of the interposer, aligning and bonding a backplate to the plurality of die, and reducing at least one portion of the interposer to create a reconstituted wafer.

In another illustrative embodiment, an apparatus comprises an interposer operable to receive at least one donor semiconductor device disposed on a first surface of the interposer and aligned therewith, and at least one host semiconductor device disposed on a second surface of the interposer and aligned therewith; where the interposer allows the at least one donor and host semiconductor devices to become vertically integrated. In yet another illustrative embodiment, a method comprises providing an interposer, aligning and bonding a plurality of donor die onto a first surface of the interposer using a first alignment mark present thereon to create a reconstituted donor wafer, and aligning and bonding a host wafer to a second surface of the interposer using a second alignment mark present thereon to allow the reconstituted donor wafer and the host wafer to become vertically integrated.

The terms "via" or "vias" is used to describe via "pads," which are areas of metal on two different layers of interconnect wiring, and that connect to one another through a vertical connection. The terms "via" or "vias," as used herein, may refer to the entire via structure or to any of its components.

The term "coupled" is defined as connected, although not necessarily directly, and not necessarily mechanically. The terms "a" and "an" are defined as one or more unless this disclosure explicitly requires otherwise. The term "substantially," "approximately," "about," and variations thereof are defined as being largely but not necessarily wholly what is specified as understood by a person of ordinary skill in the art, and in one non-limiting embodiment, the term substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Furthermore, a device or structure that is configured in a certain way is configured in at least that way, but may also be configured in ways other than those specifically described herein.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

Figure 1:
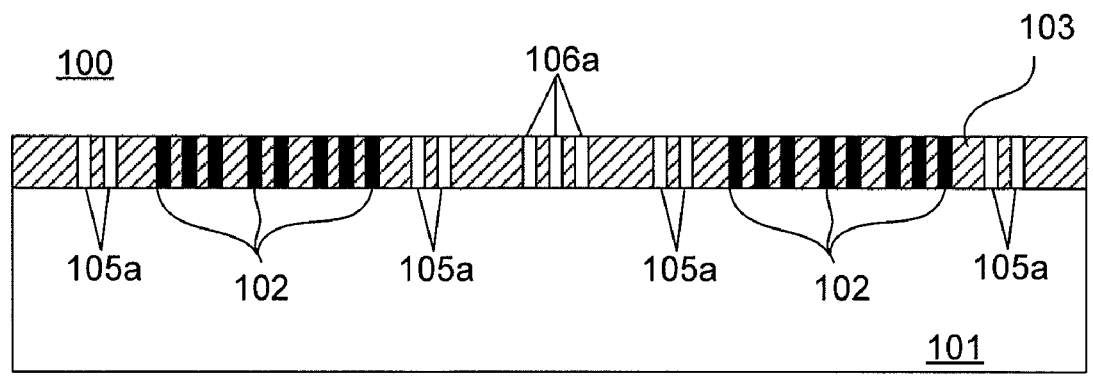
FIGS. 1-8 are cross-sectional views of a semiconductor device undergoing a vertical integration process according to certain embodiments of the present invention.

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of illustration only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

Turning now to FIGS. 1-8, cross-sectional views of a semiconductor device undergoing a vertical integration process are depicted according to certain embodiments of the present invention. The present invention may make use of an interposer for receiving and aligning donor die upon a host wafer. In the embodiment shown in FIG. 1, interposer 100 comprises interposer base 101 with dielectric layer 103 (e.g., silicon oxide or the like) formed thereon, dielectric layer 103 having first and second set of alignment marks 105*a* and 106*a*, respectively. First set of alignment marks 105*a* may be used for aligning one or more donor die 104 to interposer 100 in a first alignment step (shown in FIG. 2), whereas second set of alignment marks 106a may be used for aligning interposer 100 to host wafer 200 in a later step (shown in FIG. 6). Although in the embodiments described herein marks 106a are positioned in a location between two donor die 104 sites, marks 106a may also be located under the donor die 104 when alternative alignment methods are used. Dielectric layer 103 provides an improved bonding surface to donor die 104. Further, the use of dielectric layer 103 also facilitates several fabrication steps described in more detail below.

In one embodiment, interposer base 101 may be made of silicon. Alternatively, glass may be used to reduce costs and increase transparency. The transparency of glass may be helpful for alignment purposes during fabrication. The glass may be chosen with a formulation that approximately matches the thermal coefficient of expansion (TCE) of the host wafer. In this regard, silicon has the advantage of providing a closer match to the TCE of the devices that are being processed.

In another embodiment, interposer 100 may include redistribution layers (not shown) that allow the use of donor die whose pads or connections do not physically align with a host wafer. These redistribution layers are additional layers of interconnect typically used to move the location of the bond pads. Additionally or alternatively, interposer 100 may include a release layer (not shown) between interposer base 101 and dielectric layer 103 that allows for the efficient removal and potential reuse of base 101.

Figure 8:
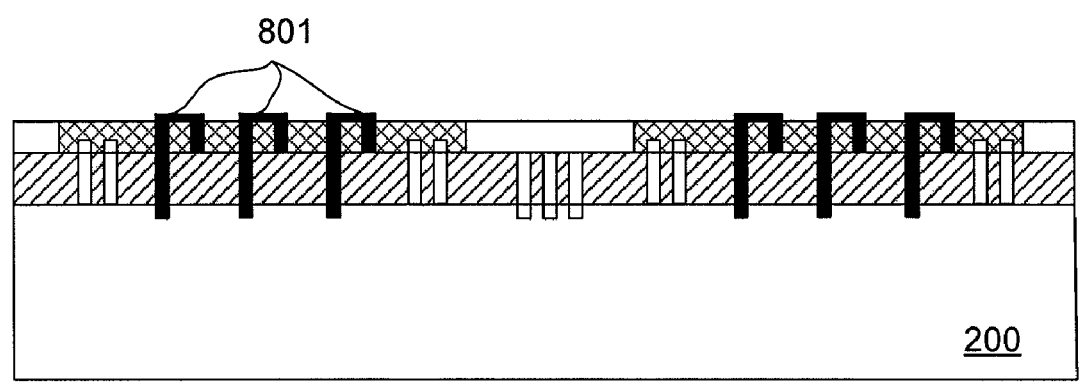

FIG. 1 also shows that interposer 100 has a plurality of vias 102 fabricated in dielectric layer 103. In this illustrative embodiment, electrical contact to vias 102 is made when donor die 104 are bonded to interposer 100 and also when interposer 100 is bonded to host wafer 200. In one alternative embodiment, however, there may be no vias in dielectric layer 103 before the bonding of donor die 104 to interposer 100 in the step shown in FIG. 1. Instead, the vias may be fabricated after donor die 104 have been bonded and interposer base 101 has been removed—e.g., after the step depicted in FIG. 5. Electrical connections between the vias and host wafer 200 is then made at the time interposer 100 is bonded to host wafer 200. In yet another alternative embodiment, the vias are fabricated only after both align and bond steps of donor die 104 to interposer 100 and interposer 100 to host wafer 200 as shown in FIG. 8.

Figure 2:
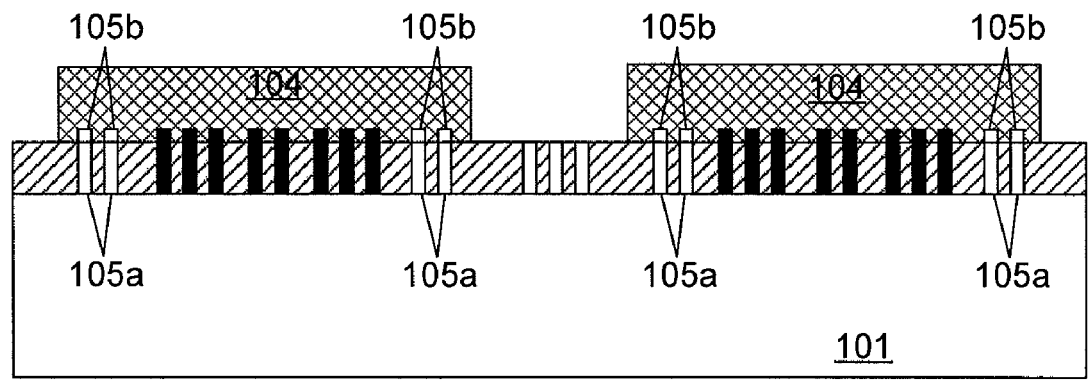
Figure 3:
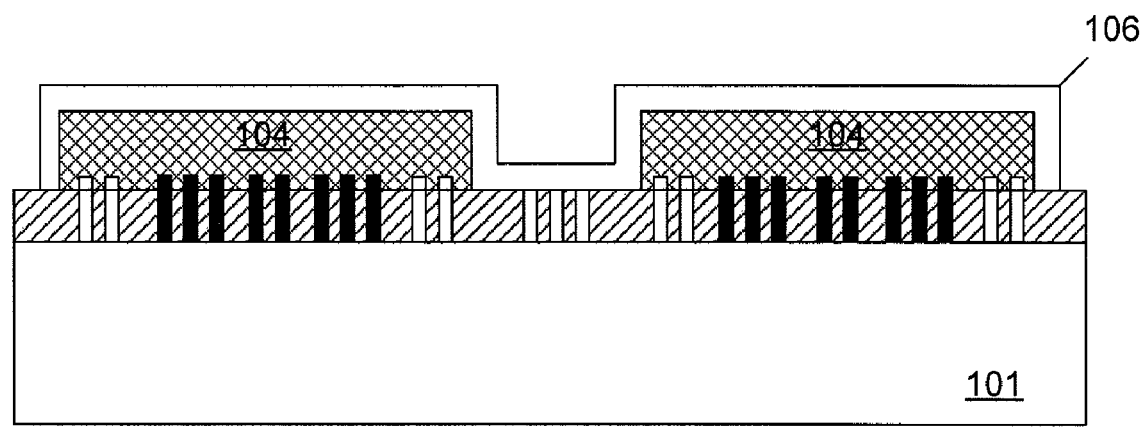

In FIG. 2, donor die 104 are stacked upon interposer 100 in an first align and bond step. For example, alignment marks 105b of donor die 104 may be aligned to alignment marks 105a of interposer 100. In an alternative embodiment, vias 102 (when present) may be used to perform the alignment. Bonding processes such as metal, dielectric, and polymer bonding techniques known in the art may then be used. In FIG. 3, dielectric layer 106 may be optionally deposited on the resulting structure of FIG. 2 to protect the donor die 104's edges, for example, during subsequent thinning steps. Further, dielectric layer 106 may provide a planar surface for subsequent wafer processing steps. Dielectric layer 106 should be thick enough so that it provides a substantially planar surface together with the back of donor die 104 at a later step in the process shown in FIG. 7. In some embodiments, dielectric layer 106 may be about 5 to 50 µm thick.

Figure 4:
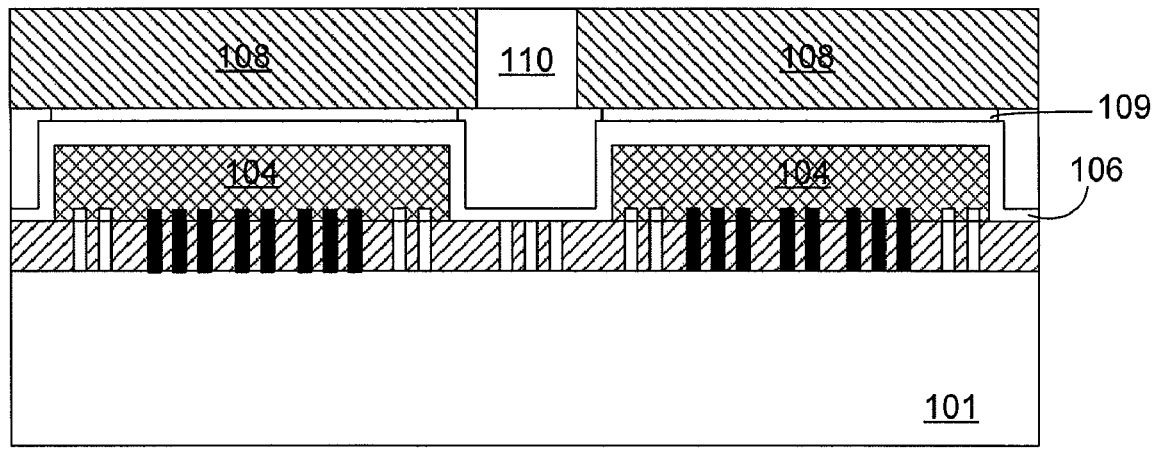

Next, as shown in FIG. 4, backplate 108 is attached to dielectric layer 106. In one embodiment, backplate 108 may be attached using attach material 109 to compensate for small differences in height between different donor die 104 and areas of dielectric layer 106. Attach material 109 may also function as a release layer. Otherwise, an additional release layer (not shown) may be provided over attach material 109. In some embodiments, backplate 108 may be made of silicon, glass, or a combination thereof—e.g., silicon with glass window (or gap) 110. Window 110 may be transparent and thus useful for visualization of alignment marks 106a for alignment purposes during fabrication. After alignment, the spaces on host wafer 200 not covered with donor die 104 may be filled with materials commonly used in the art to provide structural and/or dimensional stability, strength, and/or physical uniformity. These materials may be optionally dispensed in a pattern so as not to occupy the spaces above alignment marks 106a.

Figure 5:
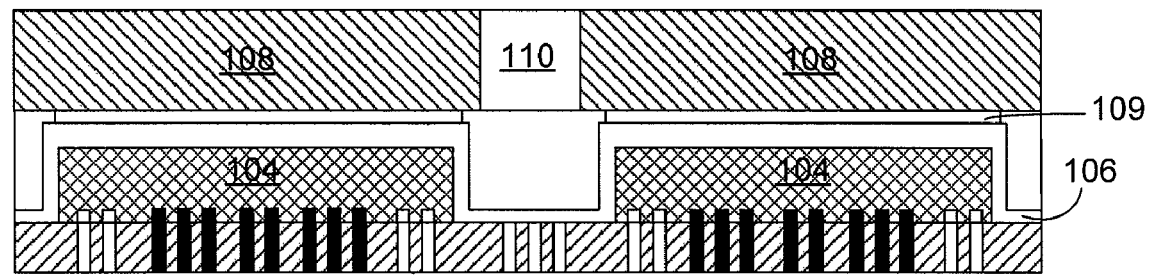

In a subsequent step depicted in FIG. 5, interposer base 101 may be reduced either by being thinned or released from the structure. In one embodiment, the optional release layer may be removed in a processing step employing one or more of high temperature, ultraviolet radiation, chemical and/or mechanical methods. Interposer base 101 may then be reused in subsequent processes. In another embodiment, interposer base 101 may be thinned and disposed of using common thinning techniques known in the art.

There may be applications where the processing ends after the step shown in FIG. 5, thus yielding a reconstituted wafer that does not get bonded to another wafer such as host wafer 200. The reconstituted wafer may then undergo additional processes—e.g., addition of wiring layers, bond pads, etc. In this manner, the reconstituted wafer may comprise different donor die 104 that are interconnected. Further, donor die 104 may be tested before reconstitution such that only the presumed good ones—i.e., the ones that passed the test—may be used in the process therefore providing a reconstituted wafer that has a 100% (or another chosen percentage) of tested die.

Figure 6:
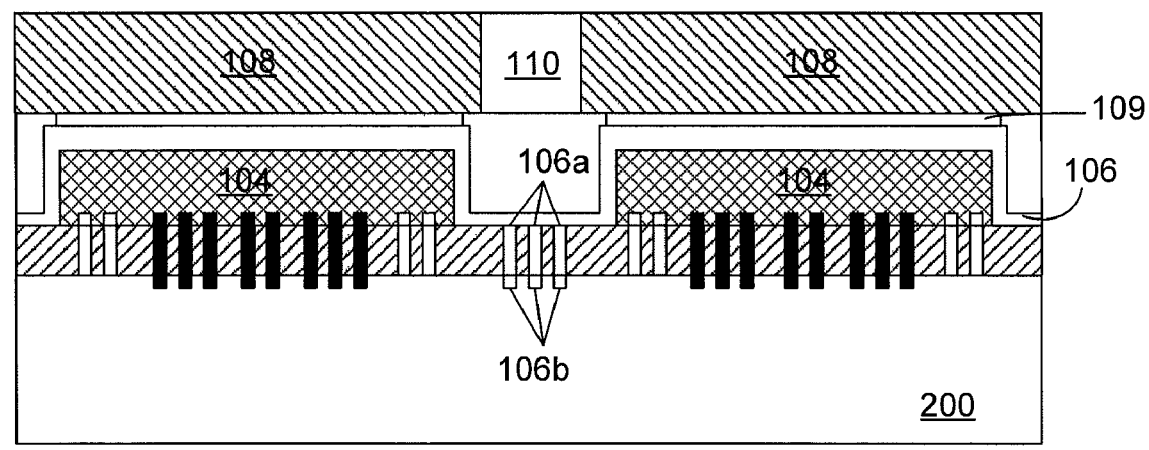

In the step shown in FIG. 6, the reconstituted donor die 104 are stacked upon host wafer 200 in a second align and bond step. Host wafer 200 may have alignment marks 106b present thereon. Accordingly, corresponding alignment marks 106a and 106b may be aligned in the spaces between donor die 104 under window 110. Backplate 108 may then be thinned or released using techniques known in the art and similar to those used to thin and/or release interposer base 101. In one embodiment, backplate 108 is released so that it may be reused in subsequent processes.

Before performing the step shown in FIG. 6, host wafer 200 may be tested so that interposer 100 may be populated with donor die 104 only at sites that correspond to sites on host wafer 200 that have passed a test. This testing procedure may avoid wasting donor die 104 by inadvertently pairing them with bad host die on host wafer 200. In one embodiment, host wafer 200 is itself a reconstituted wafer having a high percentage of tested sites. The reconstituted host wafer may be fabricated using the steps described above, thus increasing yield during vertical integration.

Figure 7:
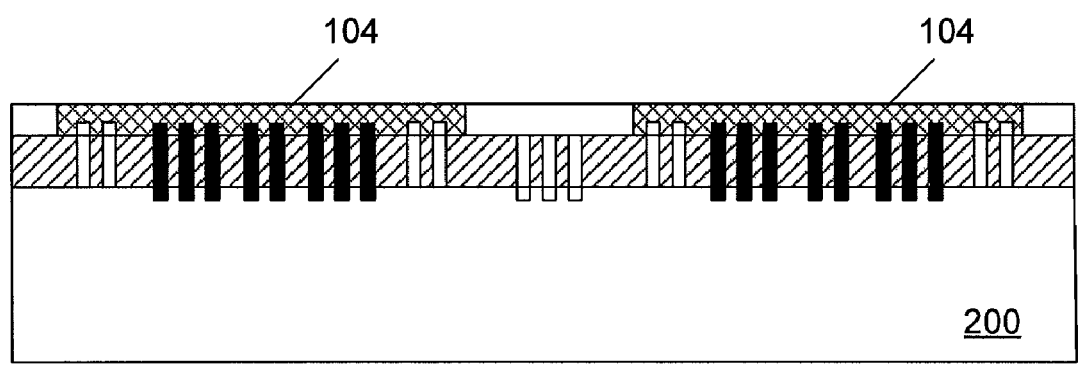

As shown in FIG. 7, donor die 104 may be thinned to a final thickness of less than, or approximately equal to, the thickness of dielectric layer 106 using techniques known in the art—e.g., grinding and polishing. In this manner, the top surface of the structure including the back of die 104 and dielectric 106 may be substantially co-planar and ready for further wafer-level processing. An example of further processing is the fabrication of additional wiring layers or bond pads. This further processing may be followed by separation of the vertically integrated die. Also, the further processing may include repeating the steps illustrated in FIGS. 1-7 to add yet another layer of donor die. As such, the processes described herein may be repeated to yield a semiconductor device with more than two vertically integrated layers of individual die.

In the alternative embodiment shown in FIG. 8, interposer 100 originally shown in FIG. 1 does not have vias fabricated in dielectric layer 103, and instead all electrical connections

801 are made as a last step in the process ("vias-last"). Additionally or alternatively, connections 801 may be fabricated during other steps in the overall integration method, for example, after interposer 100 has been reduced and before boding interpose 101 to host wafer 200. These embodiments may be chosen depending upon tradeoffs in terms of cost, reliability, and impact on design.

As described in detail above, the present invention provides systems and methods for vertically integrating semiconductor devices. In one embodiment, a semiconductor wafer is reconstituted using singulated die. The reconstituted wafer may be further processed with a wafer-to-wafer integration flow. One advantage of the present invention is that it provides an interposer structure for aligning a plurality of die and providing a planar surface for the reconstituted wafer. The interposer optimizes die alignment and bonding steps to increase alignment accuracy and improve throughput. Moreover, the interposer provides several manufacturing advantages such as lower costs, reduced cycle times and the like.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:

1. A method comprising:
   providing an interposer, where the interposer comprises an interposer base and a dielectric layer;
   aligning and bonding a plurality of die to the dielectric layer of the interposer;
   depositing a passivation layer on the plurality of die and the dielectric layer;
   aligning and bonding a backplate to the passivation layer;
   creating a reconstituted wafer by removing the interposer base;
   aligning and bonding a host wafer to the dielectric layer of the reconstituted wafer;
   removing the backplate from the plurality of die; and
   reducing the plurality of die and the passivation layer to create a planar surface suitable for further wafer-level processing.

2. The method of claim 1, further comprising providing a release layer between the interposer base and the dielectric layer so that creating the reconstituted wafer comprises using the release layer to release the base.

3. The method of claim 1, where the host wafer comprises a reconstituted host wafer.

4. The method of claim 1, where the interposer comprises a first and second sets of alignment marks.

5. The method of claim 4, further comprising aligning the plurality of die to the dielectric layer of the interposer with respect to the first set of alignment marks.

6. The method of claim 4, where the backplate comprises at least one transparent portion over the second set of alignment marks to facilitate the alignment of the host wafer to the reconstituted wafer.

7. The method of claim 5, further comprising aligning the host wafer to the reconstituted wafer with respect to the second set of alignment marks.

8. The method of claim 5, where the second set of alignment marks is positioned between at least two of the plurality of die.

9. The method of claim 8, further comprising filling a space between at least two of the plurality of die in a pattern so as to maintain the second set of alignment marks visible.

10. The method of claim 1, further comprising providing a release layer between the plurality of die and the backplate and using the release layer to release the backplate.

11. The method of claim 1, where the dielectric layer comprises silicon oxide.

12. The method of claim 11, where the dielectric layer consists of a single silicon oxide layer.

13. The method of claim 1, where the dielectric layer comprises a via that forms an electrical connection between a first die of the plurality of die and the host wafer.

14. The method of claim 1, where reducing the plurality of die comprises reducing the plurality of die to a thickness less than or equal to the thickness of the dielectric layer.

15. The method of claim 1, further comprising fabricating a via through the dielectric layer and a first die, where the first die is one of the plurality of die.

16. The method of claim 15, where the via forms at least part of an electrical connection between the host wafer and the first die.

17. The method of claim 1, where the interposer base comprises glass.

18. The method of claim 1, where the interposer base comprises silicon.

* * * * *

UNITED STATES PATENT AND TRADEMARK OFFICE
CERTIFICATE OF CORRECTION

Page 1 of 1

PATENT NO. : 8,338,267 B2
APPLICATION NO. : 11/776069
DATED : December 25, 2012
INVENTOR(S) : Smith It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 704 days.

Signed and Sealed this
Thirteenth Day of January, 2015

Michelle K. Lee
*Deputy Director of the United States Patent and Trademark Office*